(12) United States Patent
Kornmeyer

(10) Patent No.: US 11,873,559 B2
(45) Date of Patent: Jan. 16, 2024

(54) PLASMA BOAT FOR RECEIVING WAFERS WITH REGULATED PLASMA DEPOSITION

(71) Applicant: Nippon Kornmeyer Carbon Group GmbH, Windhagen (DE)

(72) Inventor: Torsten Kornmeyer, Königswinter (DE)

(73) Assignee: Nippon Kornmeyer Carbon Group GmbH, Windhagen (DE)

( * ) Notice: Subject to any disclaimer, the term of this patent is extended or adjusted under 35 U.S.C. 154(b) by 190 days.

(21) Appl. No.: 17/251,442

(22) PCT Filed: Jun. 13, 2019

(86) PCT No.: PCT/EP2019/065492
§ 371 (c)(1),
(2) Date: Dec. 11, 2020

(87) PCT Pub. No.: WO2019/238821
PCT Pub. Date: Dec. 19, 2019

(65) Prior Publication Data
US 2021/0363636 A1 Nov. 25, 2021

(30) Foreign Application Priority Data

Jun. 13, 2018 (DE) .................... 10 2018 114 159.9

(51) Int. Cl.
*C23C 16/458* (2006.01)
*H01L 21/673* (2006.01)
*C23C 16/50* (2006.01)

(52) U.S. Cl.
CPC ...... *C23C 16/4587* (2013.01); *C23C 16/4581* (2013.01); *H01L 21/67313* (2013.01); *C23C 16/50* (2013.01)

(58) Field of Classification Search
CPC .......... C23C 16/4587; H01L 21/67313; H01J 37/32715
See application file for complete search history.

(56) References Cited

U.S. PATENT DOCUMENTS

| 2005/0159010 A1 | 7/2005 | Bhardwaj et al. |
| 2016/0111319 A1 | 4/2016 | Voelk et al. |

(Continued)

FOREIGN PATENT DOCUMENTS

| CN | 107924853 A | 4/2018 |
| CN | 107750282 B | 11/2019 |

(Continued)

*Primary Examiner* — Karla A Moore
*Assistant Examiner* — Nathan K Ford
(74) *Attorney, Agent, or Firm* — Smartpat PLC

(57) ABSTRACT

A plasma boat for receiving wafers with partial damping of the plasma deposition comprises a number of boat plates spaced apart in parallel, which are provided with wafer holders for receiving upright wafers, in order to securely hold the wafers during transport and during the depositing process in a coating chamber, and wherein the boat plates are mechanically connected to one another by electrically insulating spacers. This provides a plasma boat, with regulated plasma deposition, which ensures a deposition on wafers that is uniform over the surface area thereof and has a constant layer thickness. This is achieved by a damping element (12) being respectively arranged between the wafer holders (16) located parallel to one another, between adjacent boat plates (15), and electrically insulated with respect to the latter on spacer elements (2).

10 Claims, 4 Drawing Sheets

(56) References Cited

U.S. PATENT DOCUMENTS

| | | | |
|---|---|---|---|
| 2018/0033618 A1* | 2/2018 | Ogawa | C23C 16/402 |
| 2018/0076071 A1 | 3/2018 | Klick et al. | |
| 2018/0119278 A1* | 5/2018 | Kornmeyer | C23C 16/4587 |
| 2018/0337079 A1* | 11/2018 | Völk | H01L 21/67754 |

FOREIGN PATENT DOCUMENTS

| | | |
|---|---|---|
| WO | 2014194892 A1 | 12/2014 |
| WO | 2016166125 A1 | 10/2016 |
| WO | 2017085178 A1 | 5/2017 |

\* cited by examiner

PLASMA BOAT FOR RECEIVING WAFERS WITH REGULATED PLASMA DEPOSITION

TECHNICAL FIELD

The disclosure relates to a plasma boat for receiving wafers with regulated plasma deposition.

BACKGROUND

Plasma boats are used, for example, as PECVD boats for Plasma-Enhanced Chemical Vapor Deposition (PECVD). An example of one such particularly lightweight PECVD boat is disclosed by WO 2016/166125 A1. The PECVD boats in this case consist of individual boat plates with a lower frame element from which wafer holders protrude, the latter respectively enclosing in a u-shape the circumferential edges of the rectangular wafers to be received in a row and containing a plurality of reception elements that engage the circumferential edges of the wafers in the shape of a fork at three points. Conventionally, a plurality of such boat plates are arranged in parallel next to one another and are connected to one another by means of insulating spacers, so that a multiplicity of wafers can be received parallel next to one another and behind one another.

The boat plates consist of an electrically conductive material such as graphite, titanium, so that a plasma can be formed between the wafers located in the plasma boat during the plasma deposition when an electrical potential is applied.

A further example of plasma boats with a parallel separated arrangement of the wafers is disclosed by WO 2017/085178 A1, relating to a wafer boat and a plasma treatment device for wafers.

The PECVD boats on the one hand fulfill the function of holding the rectangular wafers securely during transport into or out from a coating chamber and during the deposition process, and on the other hand an electrical potential required for the deposition process must be applied to the wafers by means of the PECVD boat, or the boat plates, in order to ignite a plasma required for the coating process.

In order to reduce the thermal mass, the boat plates are provided with milled recesses or openings which are smaller than the contour of the wafers to be received, or in which the circumferential edges of the wafers are enclosed in a u shape.

The time needed for heating to the required process temperature is determined in particular by the number of wafers to be heated, the mass of the PECVD boat, the homogenization time before a uniform temperature distribution is reached, and the way in which the heating is carried out. It is to be understood that the heating time, as well as the subsequent homogenization time, should be as short as possible with a view to an effective and rapid deposition process.

In these wafer boats which are equipped with wafers, a plasma is also formed in particular between the wafers during the plasma deposition, so that too much material is deposited in some regions, particularly in the vicinity of the wafer holders and of the boat plate in the edge region, with the result that excessively thick deposits are partially formed at these places, so that a homogeneous distribution of the coating on the wafer is prevented.

SUMMARY

An object of the disclosure is to provide a plasma boat having regulated plasma deposition in order to achieve a deposit on wafers which is uniform over their area with a constant layer thickness, the heating and homogenization times not being intended to be influenced significantly.

This object is achieved by a plasma boat of the type mentioned in the introduction, in that between the wafer receptacles located parallel next to one another, attenuation elements are in each case arranged between neighboring boat plates and are electrically insulated from them.

In this particularly simple way, partial attenuation of the plasma deposition in the edge region is achieved without the heating and homogenization times being significantly influenced.

The attenuation elements are arranged on or between insulating spacing elements between two neighboring boat plates while being electrically insulated from them.

Preferably, the attenuation elements respectively consist of a lower frame element and two vertical bars, which protrude from the lower frame element at a distance from one another and which respectively extend into the gap between two wafer receptacles located parallel next to one another.

The attenuation elements respectively cover an area which corresponds approximately to the lower region of the wafers located in the wafer receptacles.

In an alternative embodiment, the bars and the lower frame element of the attenuation element enclose an area which is greater than or equal to the contour of the lower half of the wafers fitted into the wafer receptacles.

The area enclosed by the bars and the lower frame element may also be less than the contour of approximately the lower half of the wafers fitted into the wafer receptacles.

In a further alternative embodiment, the attenuation element is configured as a plate with a large area, which covers the lower region of the wafers, i.e. approximately one third or half of the contour of the wafers located in the wafer receptacles.

Lastly, the attenuation element in the form of a plate may be recessed in the shape of an arc so that only the lower and the lateral edge regions of the of the wafers located in the wafer receptacles are covered.

The attenuation elements may consist of ceramic, porcelain, graphite, metal.

BRIEF DESCRIPTION OF THE DRAWINGS

The invention will be explained in more detail below with reference to an exemplary embodiment. In the associated figures of the drawing.

DETAILED DESCRIPTION

Figure 2:
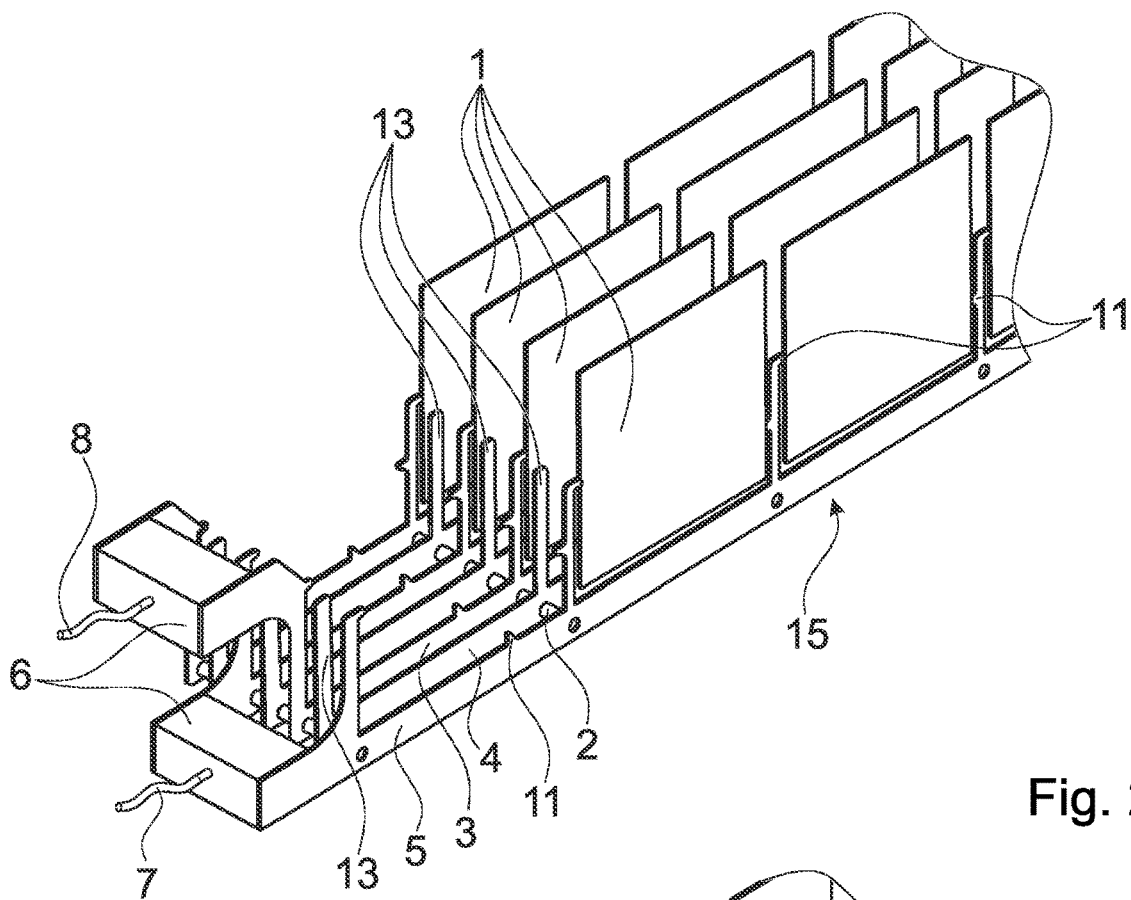
FIG. 2 shows a perspective representation of a wafer boat with attenuation elements in the form of frames, respectively consisting of a lower frame element and two vertical bars.
Figure 3:
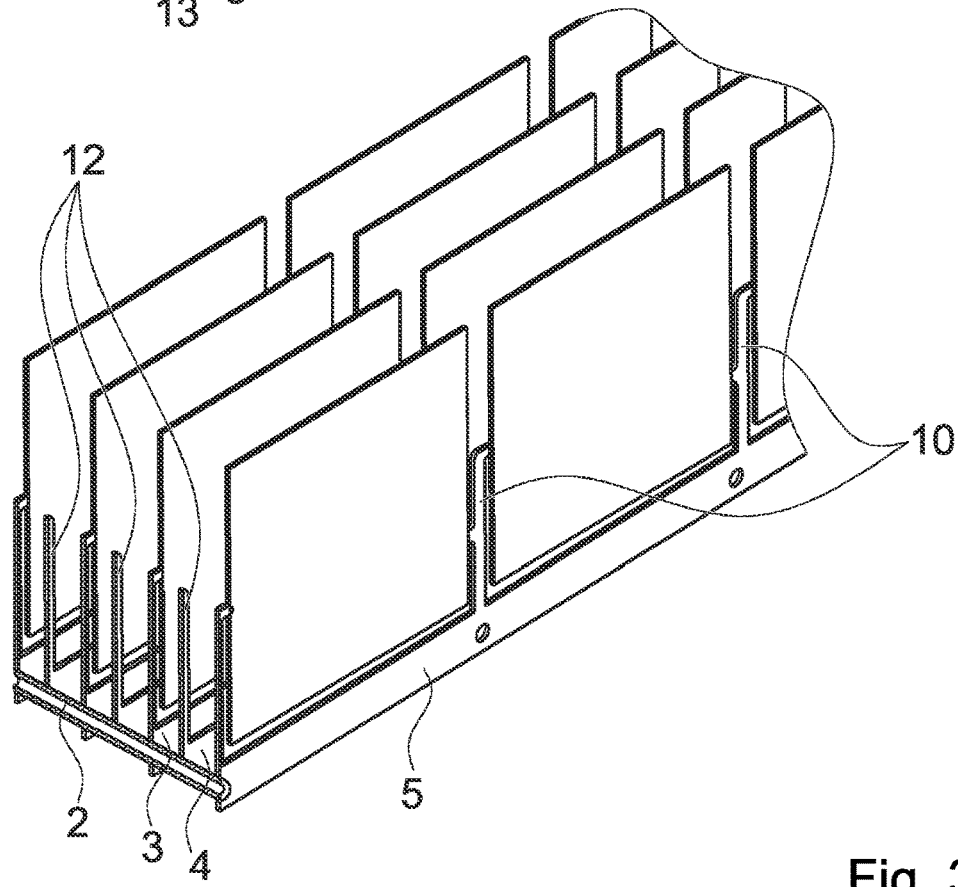
FIG. 3 shows a detail representation of a wafer boat according to FIG. 2.

As shown in FIG. 2, the wafer boat 14 consists of a plurality of boat plates 15 located parallel next to one another and oriented edge-up, having a lower frame element 3, 5 and holding arms 10 protruding from the latter with fork-, u- or v-shaped reception elements 11 oriented inward, which form the wafer receptacles 16 for receiving wafers 1 (FIG. 4), the reception elements 11 respectively enclosing the circumferential edges of the wafers 1 and securing them in the wafer receptacles 16 so that they do not fall out (FIG. 2). Each of the boat plates 15 contains a plurality of such wafer receptacles 16 arranged behind one another.

The length of the holding arms 10 is dimensioned in such a way that they reach approximately to half the height of the wafers 1 fitted into the wafer receptacles 16. In principle, it is also possible respectively to fit two wafers 1 back-to-back in the wafer receptacles 16.

For secure reception of the wafers 1 in the wafer receptacles 16, three reception elements 11 are sufficient in each case, specifically at the upper end of the holding arm 10 respectively on the left according to the drawing, approximately in the middle of the right holding arm 10, and in the lower frame element 3, 5.

Figure 4:
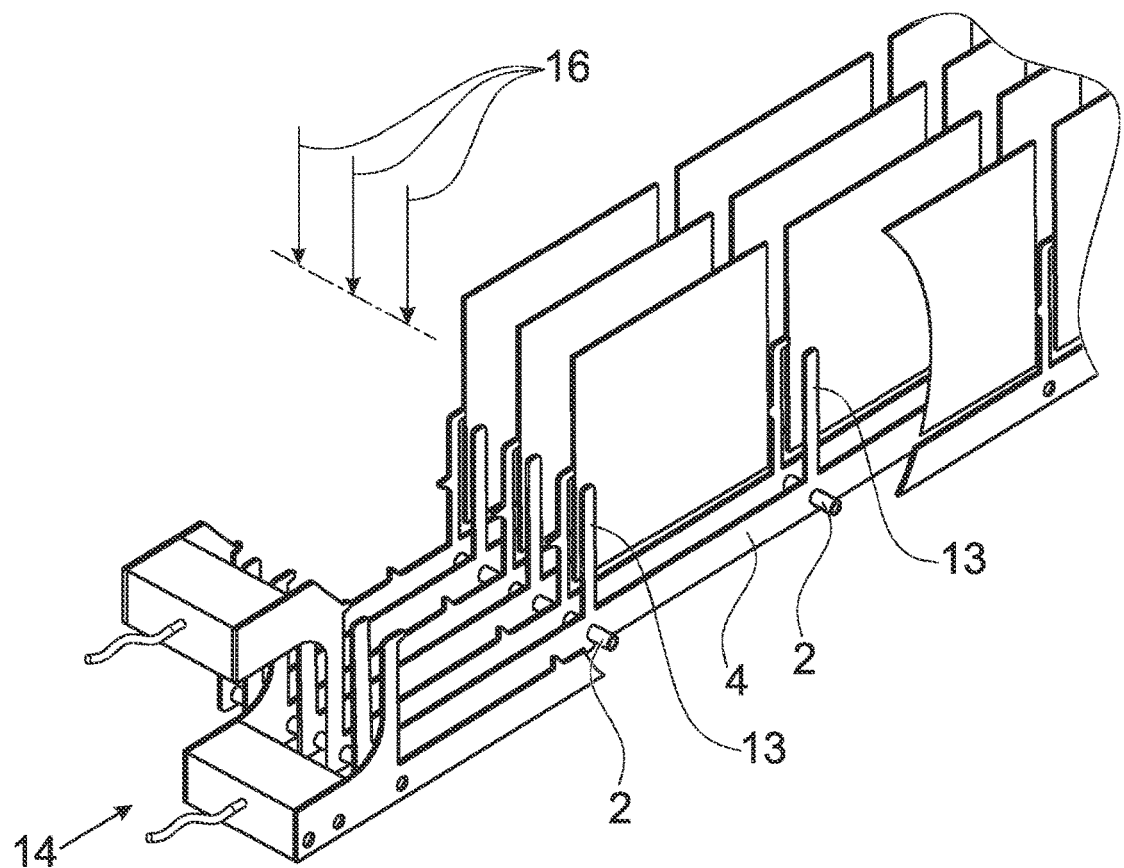
FIG. 4 shows a wafer boat, partially represented in section, with an attenuation element in the form of a frame and insulating spacers.

The boat plates 15 oriented parallel to one another, which consist of graphite, CFC or titanium, are mechanically connected to one another and held at a distance from one another by electrically insulating spacers 2 (FIG. 4).

As shown in FIG. 2, for example, four boat plates 15 are connected to one another by means of the insulating spacers 2, so that in each case four wafers 1 can be fitted parallel next to one another into the wafer receptacles 16. Furthermore, in each case the first and the third as well as the second and the fourth boat plates 15 are respectively connected electrically conductively to one another by means of connecting elements 6, which are connected in a latching fashion to different voltage potentials by means of contact elements 7, 8 when introduced into a coating chamber (not represented). That is to say, the first and the third boat plates 15 and the second and the fourth boat plates 15 are respectively at the same electrical potential.

Of course, more than four boat plates 15 may also be arranged next to one another, in which case all the odd-numbered and all the even-numbered boat plates 15 are respectively to be connected electrically to one another by the connecting elements 6.

Figure 1:
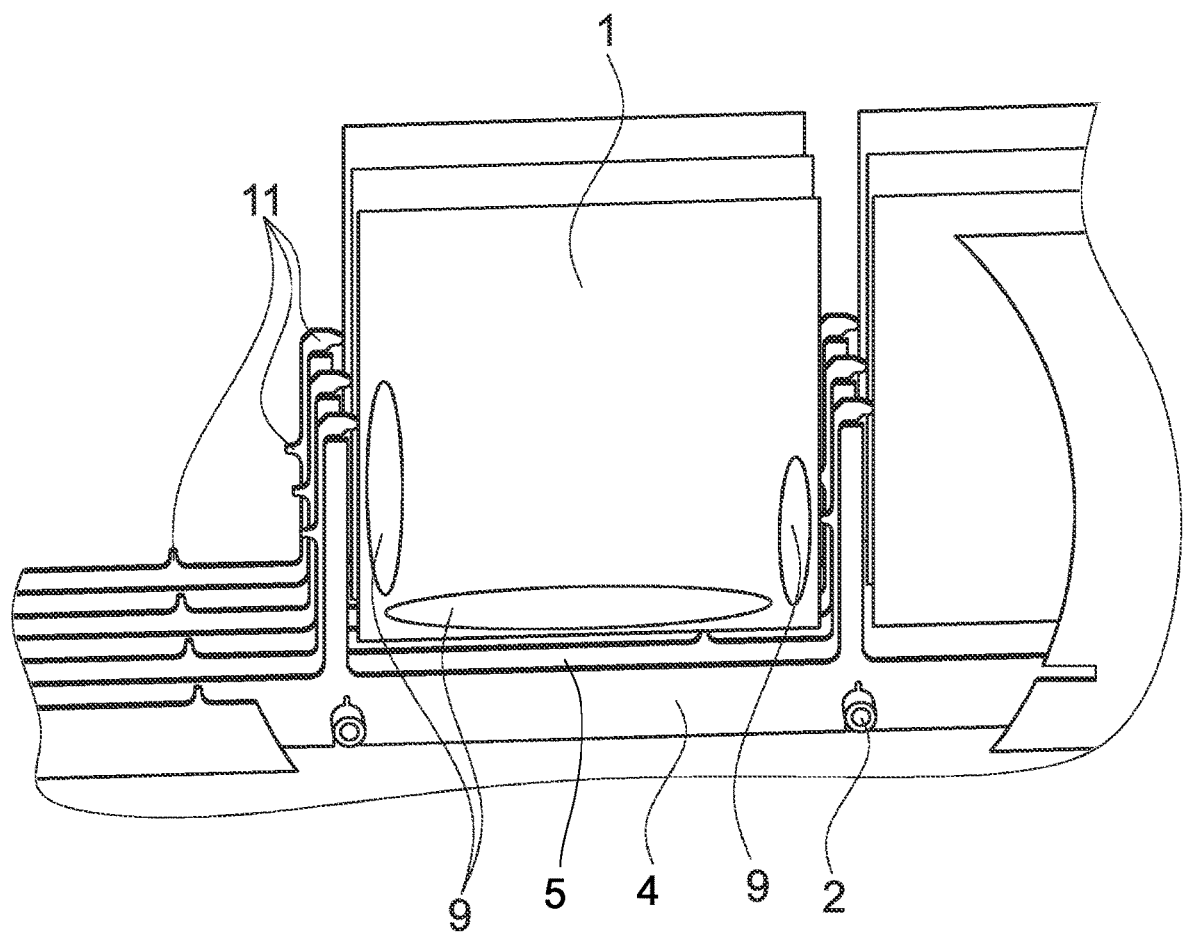
FIG. 1 shows a detail of a wafer boat with a plurality of wafers arranged next to and behind one another, on which regions with an excessively thick coating are visible in the edge region at the bottom and laterally.

During the PECVD coating process in a coating chamber, a plasma must also burn in the gap between the wafers 1, the wafers 1 being coated by supplying gases comprising the materials to be deposited. In this case, it has been found that the wafers 1 are coated nonuniformly, and specifically that, particularly in the edge region, excessively coated regions 9 are formed at the bottom and laterally, i.e. in the region of the holding arms 10 and of the lower frame element 3, 5 of the boat plate 15 (see FIG. 1). The reason for this effect is apparently is a nonuniform intensity distribution of the plasma burning between the wafers 1.

It has now been found that particularly uniform coating of the wafer 1 may be achieved with simple means.

To this end, in each case an attenuation element 12 consisting of ceramic, porcelain, graphite, metal is respectively inserted between two neighboring boat plates 15 in the region between the wafer receptacles 16. What is functionally important in this case is that the attenuation elements 12 are necessarily arranged so that they are insulated from the boat plates on or between the spacing elements 2 between two neighboring boat plates 15.

The attenuation elements 12 are in principle constructed in a similar way to the boat plates 15, but without reception elements 11, and consist of a lower frame element 4 and two vertical bars 13, which respectively extend from the lower frame element 4 at a distance from one another into the gap between two neighboring wafers, specifically in such a way that a position of the bars 13 corresponds approximately to the position of the holding arms 10 for the reception the wafers 1, the lower frame element 4 of the attenuation element 12 corresponding to the lower frame element 3, 5 of the wafer receptacle 16. The bars 13 and the lower frame element 4 of the attenuation element 12 enclose an area corresponding to the contour of the wafers 1 fitted in the wafer boat 14, although the enclosed area may also be less than the contour of the wafer 1 (FIG. 4).

Figure 5:
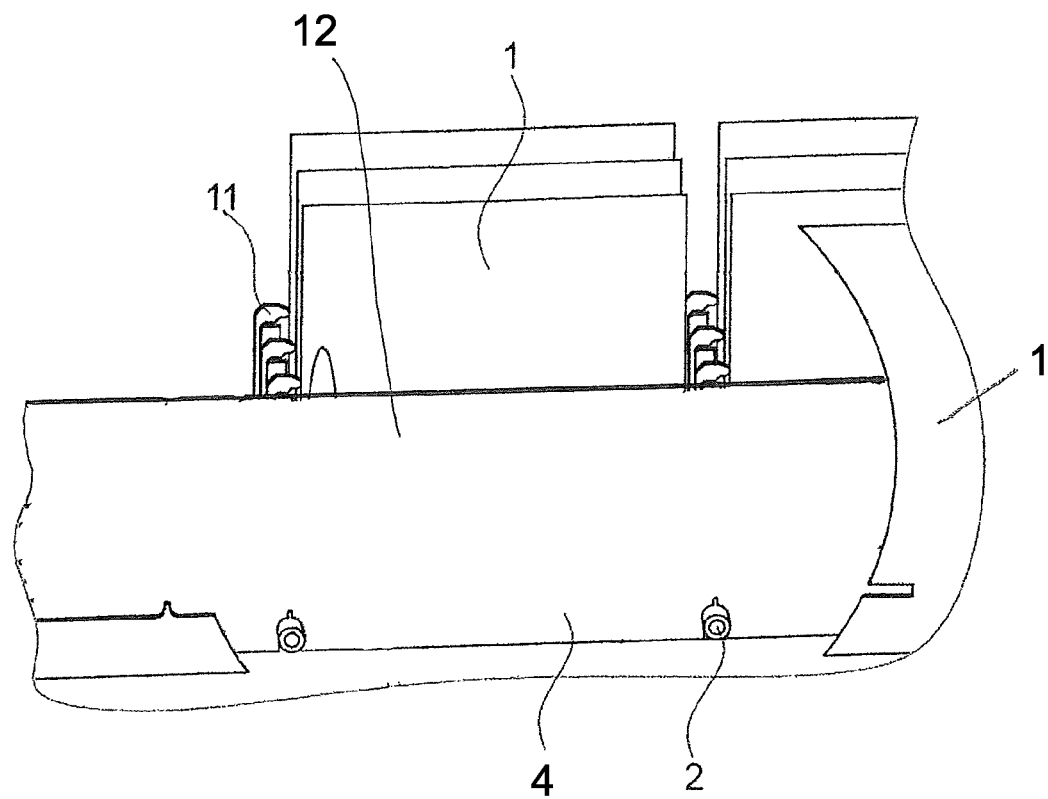
FIG. 5 shows a wafer boat, partially represented in section, with an attenuation element configured as a plate with a large area which covers the lower region of the wafers.

The attenuation element 12 may also be configured as a plate with a large area, which covers the lower region of the wafers 1, i.e. approximately one third or half of the gap between neighboring wafers 1 (FIG. 5).

Figure 6:
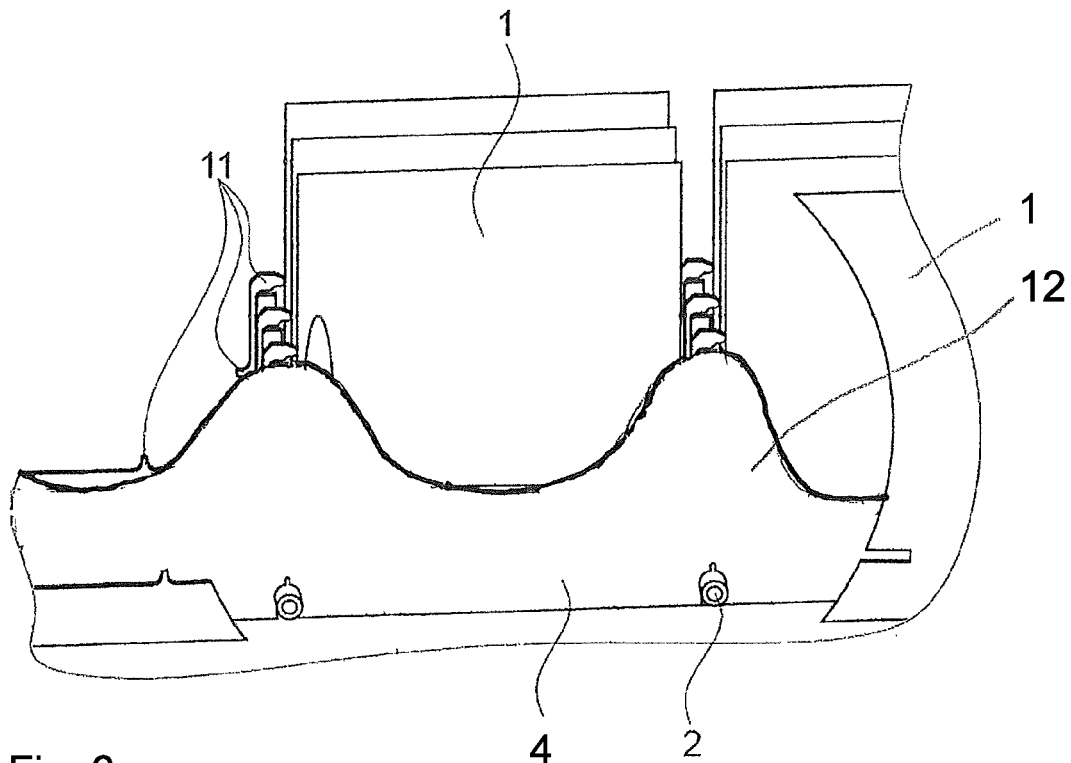
FIG. 6 shows a wafer boat, partially represented in section, with an attenuation element in the form of a plate that is recessed in the shape of an arc so that only the lower and the lateral edge regions of the wafers located in the wafer receptacles are covered.

Alternatively, the attenuation element 12 may also be recessed in the shape of an arc so that only the lower and the lateral edge regions of the wafers 1 are covered (FIG. 6).

The effect achieved by the attenuation elements 12 is that the plasma can no longer burn over the entire area between the neighboring wafers 1 and is partially attenuated by the attenuation elements 12, particularly in the regions 9 which are otherwise exposed to excessive coating. The result is regularization of the coating of the surface of the wafers over the entire area.

A further advantage of the attenuation elements 12 between the wafer receptacles 16 is that the heating and homogenization times of the plasma boat equipped with wafers 1 are not significantly influenced.

LIST OF REFERENCE SIGNS 1 wafer
2 spacer
3 lower frame element
4 lower frame element of the attenuation element
5 lower frame element
6 connecting element
7 contact element
8 contact element
9 excessively coated region
10 holding arm
11 reception element
12 attenuation element
13 vertical bar
14 wafer boat
15 boat plate
16 wafer receptacle

The invention claimed is:
1. A plasma boat for receiving wafers (1) with partial attenuation of a plasma deposition, comprising:
a plurality of boat plates (15) arranged parallel and at a distance from one another, which are provided with wafer receptacles (16) for upright reception of the wafers (1), which respectively comprise
a lower frame element (3) and
holding arms (10) protruding from the lower frame element (3) with reception elements (11) oriented inward which respectively enclose circumferential edges of the wafers (1), in order to hold the wafers (1) securely during transport and during a deposition process in a coating chamber, the boat plates (15) being mechanically connected to one another by electrically insulating spacers (2), wherein the boat plates (15) are alternatingly electrically conductively connected to a first contact and to a second contact, the first contact being connected to a first voltage potential, the second contact being connected to a second voltage potential, and the first voltage potential and the second voltage potential being different, wherein an attenuation element (12) is in each case arranged between neighboring boat plates (15) while being electrically insulated from them, and wherein each of the attenuation elements (12) is a plate spanning a width of the plasma boat and with an area that covers one third to half of the face of each wafer (1) located in the wafer receptacles (16).

2. The plasma boat as claimed in claim 1,
wherein each of the attenuation elements (12) is recessed in the shape of an arc so that only lower and lateral edge regions of the wafers (1) located in the wafer receptacles (16) are covered.

3. A plasma boat for receiving wafers (1) with partial attenuation of a plasma deposition, comprising:

a plurality of boat plates (15) arranged parallel and at a distance from one another, which are provided with wafer receptacles (16) for upright reception of the wafers (1), which respectively comprise a lower frame element (3) and holding arms (10) protruding from the lower frame element (3) with reception elements (11) oriented inward which respectively enclose circumferential edges of the wafers (1), in order to hold the wafers (1) securely during transport and during a deposition process in a coating chamber, the boat plates (15) being mechanically connected to one another by electrically insulating spacers (2), wherein the boat plates (15) are alternatingly electrically conductively connected to a first contact and to a second contact, the first contact being connected to a first voltage potential, the second contact being connected to a second voltage potential, and the first voltage potential and the second voltage potential being different, wherein an attenuation element (12) is in each case arranged between neighboring boat plates (15) while being electrically insulated from them, wherein each of the attenuation elements (12) comprises a lower horizontal bar (4) spanning a width of the plasma boat and vertical bars (13) extending upwardly from the lower horizontal bar (4), wherein the vertical bars (13) of the attenuation elements (12) are aligned with the holding arms (10) of the wafer receptacles (16).

4. The plasma boat as claimed in claim 3,
wherein the attenuation elements (12) are arranged on or between the insulating spacers (2) respectively between two neighboring boat plates (15).

5. The plasma boat as claimed in claim 3,
wherein the attenuation elements (12) respectively consist of the lower horizontal bar (4) and two vertical bars (13), which protrude from the lower horizontal bar (4) at a distance from one another and which respectively extend into a gap between two wafer receptacles (16).

6. The plasma boat as claimed in claim 5,
wherein the attenuation elements (12) respectively cover an area which corresponds approximately to the lower half of the wafers (1) located in the wafer receptacles (16).

7. The plasma boat as claimed in claim 5,
wherein the two vertical bars (13) and the lower horizontal bar (4) of the attenuation element (12) enclose an area which is greater than or equal to the lower half of the wafers (1) fitted into the wafer receptacles (16).

8. The plasma boat as claimed in claim 5,
wherein an area enclosed by the two vertical bars (13) and the lower horizontal bar (4) is less than the lower half of the wafers (1) fitted into the wafer receptacles (16).

9. The plasma boat as claimed in claim 3,
wherein the attenuation elements (12) consist of ceramic, porcelain, graphite, metal.

10. The plasma boat as claimed in claim 3,
wherein the plurality of boat plates (15) comprises
a first boat plate arranged next to a second boat plate,
the second boat plate being arranged next to a third boat plate, and
the third boat plate being arranged next to a fourth boat plate, and wherein the first boat plate and the third boat plate are connected to a first voltage potential through the first contact, and wherein the second boat plate and the fourth boat plate are connected to a second voltage potential through the second contact, and wherein the first voltage potential and the second voltage potential are different.

* * * * *